United States Patent
Joshi et al.

(10) Patent No.: US 10,490,482 B1
(45) Date of Patent: Nov. 26, 2019

(54) COOLING DEVICES INCLUDING JET COOLING WITH AN INTERMEDIATE MESH AND METHODS FOR USING THE SAME

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/210,515

(22) Filed: Dec. 5, 2018

(51) Int. Cl.
*H01L 23/473* (2006.01)
*H01L 23/367* (2006.01)
*H01L 21/48* (2006.01)
*F28F 3/02* (2006.01)
*H05K 7/20* (2006.01)

(52) U.S. Cl.
CPC ...... *H01L 23/4735* (2013.01); *H01L 23/3677* (2013.01); *F28F 3/022* (2013.01); *H01L 21/4882* (2013.01); *H05K 7/20927* (2013.01)

(58) Field of Classification Search
None
See application file for complete search history.

(56) References Cited

U.S. PATENT DOCUMENTS

| | | | | |
|---|---|---|---|---|
| 4,567,505 A | * | 1/1986 | Pease | H01L 23/367 165/104.33 |
| 4,637,456 A | * | 1/1987 | Niggemann | F28F 13/02 165/104.33 |
| 4,638,858 A | * | 1/1987 | Chu | F28F 13/12 165/181 |
| 4,894,709 A | * | 1/1990 | Phillips | F28F 3/12 257/714 |
| 4,938,280 A | * | 7/1990 | Clark | H01L 23/427 165/80.4 |
| 4,948,965 A | * | 8/1990 | Feller | H01J 43/246 250/207 |

(Continued)

FOREIGN PATENT DOCUMENTS

CN   107567247   1/2018

OTHER PUBLICATIONS

"Jet impingement and spray cooling using slurry of nanoencapsulated phase change materials"; https://www.sciencedirect.com/science/article/pii/S0017931011001608 Published/Accessed: Jun. 2011.

*Primary Examiner* — William H. Mayo, III
*Assistant Examiner* — Krystal Robinson
(74) *Attorney, Agent, or Firm* — Dinsmore & Shohl LLP

(57) ABSTRACT

An assembly includes a substrate defining a base portion defining a plurality of orifices that extend through the base portion, the plurality of orifices defining a plurality of jet paths extending along and outward from the plurality of orifices, a mesh coupled to the base portion, the mesh defining a plurality of pores aligned with the plurality of jet paths, an encapsulated phase-change layer positioned on the mesh, and a heat-generating device coupled to the mesh opposite the base portion, the heat-generating device defining a bottom surface that is oriented transverse to the plurality of jet paths.

20 Claims, 6 Drawing Sheets

(56) References Cited

U.S. PATENT DOCUMENTS

| | | | | |
|---|---|---|---|---|
| 5,016,090 A * | 5/1991 | Galyon | H01L 23/4336 | 257/714 |
| 5,051,814 A * | 9/1991 | Paal | H01L 23/367 | 165/104.33 |
| 5,108,704 A * | 4/1992 | Bowers | B01D 61/18 | 210/323.1 |
| 5,111,278 A * | 5/1992 | Eichelberger | H01L 23/473 | 257/698 |
| 5,270,572 A * | 12/1993 | Nakajima | H01L 23/4735 | 165/104.33 |
| 5,306,948 A * | 4/1994 | Yamada | G01R 1/0483 | 257/690 |
| 5,325,265 A * | 6/1994 | Turlik | H01L 23/3736 | 257/714 |
| 5,560,811 A * | 10/1996 | Briggs | B01L 9/065 | 204/451 |
| 5,894,882 A * | 4/1999 | Kikuchi | F28F 3/027 | 165/185 |
| 6,019,165 A * | 2/2000 | Batchelder | F25B 21/02 | 165/104.33 |
| 6,090,251 A * | 7/2000 | Sundberg | B01J 19/0093 | 204/450 |
| 6,096,656 A * | 8/2000 | Matzke | B81C 1/00071 | 205/122 |
| 6,459,581 B1 * | 10/2002 | Newton | H01L 23/34 | 165/80.3 |
| 6,609,560 B2 * | 8/2003 | Cho | F28D 15/043 | 165/104.26 |
| 6,988,534 B2 * | 1/2006 | Kenny | F04B 17/00 | 165/104.21 |
| 7,000,684 B2 * | 2/2006 | Kenny | F04B 17/00 | 165/104.21 |
| 7,017,654 B2 * | 3/2006 | Kenny | F28F 3/086 | 165/104.33 |
| 7,156,159 B2 * | 1/2007 | Lovette | F28F 3/12 | 165/104.33 |
| 7,556,086 B2 * | 7/2009 | Joshi | F28D 15/0233 | 165/104.17 |
| 7,928,565 B2 * | 4/2011 | Brunschwiler | H01L 21/4871 | 257/706 |
| 8,198,539 B2 * | 6/2012 | Otoshi | H01L 23/367 | 165/104.33 |
| 8,266,802 B2 * | 9/2012 | Campbell | H01L 23/4735 | 165/80.3 |
| 8,643,173 B1 * | 2/2014 | Rau | H05K 7/2029 | 165/80.4 |
| 8,659,896 B2 * | 2/2014 | Dede | H01L 23/4735 | 165/104.33 |
| 9,247,679 B2 | 1/2016 | Joshi et al. | | |
| 9,953,899 B2 * | 4/2018 | Chen | H01L 23/473 | |
| 9,968,007 B2 * | 5/2018 | Liu | H05K 7/20145 | |
| 2008/0291636 A1 * | 11/2008 | Mori | H01L 23/3735 | 361/709 |
| 2009/0032937 A1 * | 2/2009 | Mann | H01L 23/4735 | 257/712 |
| 2009/0090490 A1 * | 4/2009 | Yoshida | H01L 23/4735 | 165/104.33 |
| 2009/0139704 A1 * | 6/2009 | Otoshi | H01L 23/367 | 165/185 |
| 2011/0141690 A1 * | 6/2011 | Le | H01L 23/4735 | 361/689 |
| 2012/0063085 A1 * | 3/2012 | Dede | F28F 3/048 | 361/692 |
| 2014/0290916 A1 * | 10/2014 | Arik | F28F 3/022 | 165/120 |
| 2014/0347817 A1 * | 11/2014 | Joshi | H05K 7/20927 | 361/699 |
| 2015/0007965 A1 * | 1/2015 | Joshi | F28F 13/185 | 165/104.28 |
| 2015/0009631 A1 * | 1/2015 | Joshi | H01L 23/4336 | 361/717 |
| 2015/0348869 A1 * | 12/2015 | Joshi | H01L 23/4735 | 361/700 |
| 2018/0145010 A1 | 5/2018 | Fukuoka et al. | | |
| 2018/0218987 A1 * | 8/2018 | Watanabe | H01L 24/05 | |
| 2018/0295748 A1 * | 10/2018 | Ukegawa | H05K 7/20509 | |
| 2019/0078212 A1 * | 3/2019 | Joshi | C23C 18/1633 | |

\* cited by examiner

COOLING DEVICES INCLUDING JET COOLING WITH AN INTERMEDIATE MESH AND METHODS FOR USING THE SAME

FIELD

The present specification generally relates to apparatuses for cooling heat-generating devices and, more specifically, to cooling devices utilizing jet cooling and including an intermediate mesh.

TECHNICAL BACKGROUND

Cooling devices may be coupled to a heat-generating device, such as a power electronics device, to remove heat and lower the operating temperature of the heat-generating device. Cooling fluid may be used to receive heat generated by the heat-generating device by convective and/or conductive thermal transfer, and may remove such heat from the heat-generating device. For example, a jet of cooling fluid may be directed such that it impinges a surface of the heat-generating device.

However, as some heat-generating devices are designed to operate at increased power levels and generate increased corresponding heat flux, for example due to the demands of newly developed electrical systems, conventional cooling devices are unable to adequately remove the heat flux to effectively lower the operating temperature of the heat-generating devices to acceptable temperature levels.

Accordingly, a need exists for alternative cooling devices for cooling heat-generating devices.

SUMMARY

In one embodiment, a cooling assembly includes a substrate defining a base portion defining a plurality of orifices that extend through the base portion, the plurality of orifices defining a plurality of jet paths extending along and outward from the plurality of orifices, a mesh coupled to the base portion, the mesh defining a plurality of pores aligned with the plurality of jet paths, an encapsulated phase-change layer positioned on the mesh, and a heat-generating device coupled to the mesh opposite the base portion, the heat-generating device defining a bottom surface that is oriented transverse to the plurality of jet paths.

In another embodiment, a power electronics assembly includes a substrate including a base portion defining a plurality of orifices that extend through the base portion, the plurality of orifices defining a plurality of jet paths extending along and outward from the plurality of orifices, a mesh coupled to the base portion, the mesh defining a plurality of pores aligned with the plurality of jet paths, an encapsulated phase-change layer positioned within the mesh, and a power electronics device electrically coupled to the substrate through the mesh.

In yet another embodiment, a method for cooling a heat-generating device, the method includes passing a cooling fluid along a jet path extending along an orifice extending through a substrate, passing the cooling fluid through a pore of mesh, where the pore is aligned with the orifice, impinging the cooling fluid on a heat-generating device positioned opposite the orifice and thermally coupled to the heat-generating device, heating the mesh, and changing a matter phase of an encapsulated phase-change material of a phase-change layer positioned on the mesh.

Additional features of the cooling devices and methods for cooling heat-generating devices described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
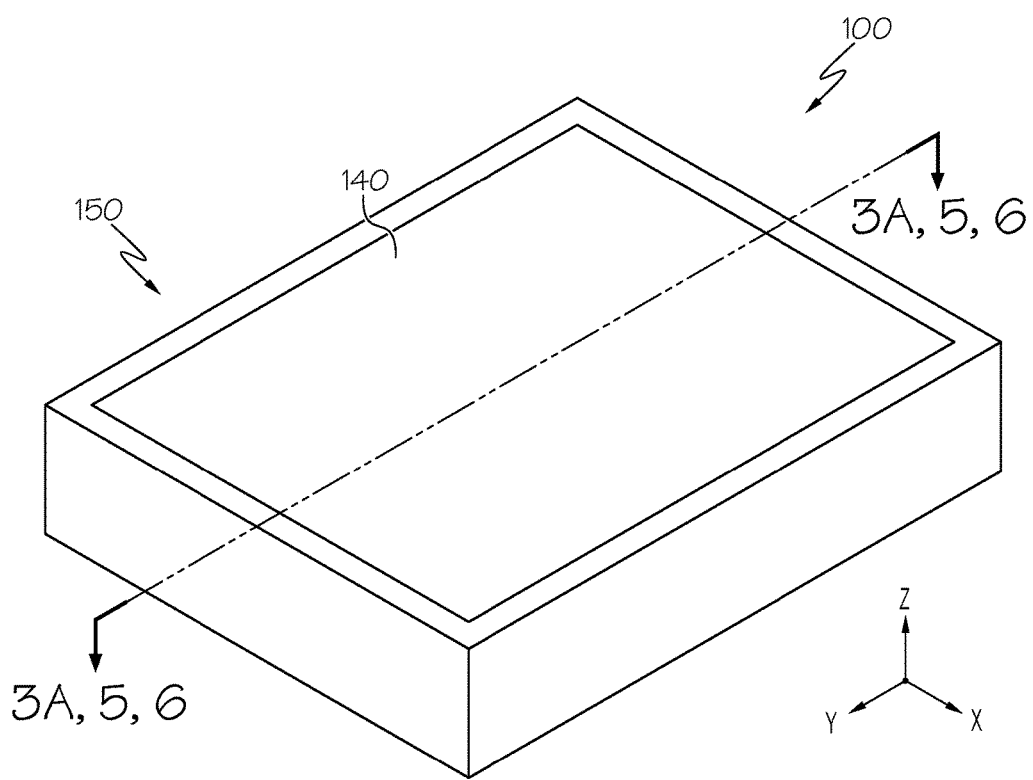
FIG. 1 schematically depicts a perspective view of a cooling assembly, according to one or more embodiments shown and described herein.

Reference will now be made in detail to embodiments of cooling devices and methods of operating the same, examples of which are illustrated in the accompanying drawings. Whenever possible, the same reference numerals will be used throughout the drawings to refer to the same or like parts.

Embodiments described herein are directed to heat-generating devices and methods for cooling the heat-generating devices. The heat-generating devices may include, as one non-limiting example, power electronics modules including a power electronics device. The power electronics device generally generates heat during operation that should be dissipated. Cooling fluid may be utilized to dissipate the heat by impinging the cooling fluid on the heat-generating device, and it is generally desirable to maximize the heat dissipated with the cooling fluid, for example by optimizing the flow characteristics of the cooling fluid (e.g., the flow velocity, the positioning of the flow, etc.).

Embodiments described herein are directed to cooling assemblies including a heat-generating device and a substrate coupled to the heat-generating device. The substrate generally includes a base portion defining a plurality of orifices extending through the base portion and a plurality of jet paths extending along and outward from the plurality of orifices. A mesh is coupled to the substrate, the mesh including a plurality of pores that are aligned with the plurality of orifices and the plurality of jet paths. The heat-generating device is coupled to the mesh and defines a bottom surface that is oriented transverse to the plurality of jet paths. Cooling fluid may be passed through the plurality of jet paths, through the plurality of pores of the mesh, and impinge on the bottom surface of the heat-generating device to remove thermal energy generated by the heat-generating device.

The plurality of pores of the mesh may change the flow pattern and/or the flow velocity of the cooling fluid to optimize the dissipation of thermal energy as the cooling fluid impinges on the heat-generating device. Additionally, in embodiments described herein, an encapsulated phase-change layer is positioned on the mesh and/or the substrate, and the phase-change layer may further dissipate heat from the heat-generating device, which may further assist in maintaining the heat-generating device at an acceptable operating temperature. Various embodiments of power electronics modules and methods for operating the same will be described herein with specific reference to the appended drawings.

As used herein, the term "longitudinal direction" refers to the forward-rearward direction of the cooling assembly (i.e., in the +/−X-direction as depicted). The term "lateral direction" refers to the cross-direction of the cooling assembly (i.e., in the +/−Y-direction as depicted), and is transverse to the longitudinal direction. The term "vertical direction" refers to the upward-downward direction of the cooling assembly (i.e., in the +/−Z-direction as depicted), and is transverse to the lateral and the longitudinal directions.

Referring initially to FIG. 1, a perspective view of a cooling assembly 100 is schematically depicted. The cooling assembly 100 generally includes a heat-generating device 140 and a housing 150 surrounding at least a portion of the heat-generating device 140. The housing 150 may be formed from a thermally conductive material that receives and dissipates heat from the heat-generating device 140. For example and without limitation, the housing 150 may be formed from aluminum, silver, gold, copper, or the like. While the heat-generating device 140 and the housing 150 depicted in FIG. 1 generally define rectangular shapes, it should be understood that the heat-generating device 140 and the housing 150 may include any suitable shape.

In embodiments, the heat-generating device 140 may include an electronics device. In some embodiments, the heat-generating device 140 may include a power electronics device that controls and/or converts electrical power. For example, the heat-generating device 140 may be one or more semiconductor devices that may include, without limitation, an insulated-gate bipolar transistor (IGBT), a reverse conducting IGBT (RC-IGBT), a metal-oxide-semiconductor field-effect transistor (MOSFET), a power MOSFET, diodes, transistors, and/or combinations thereof (e.g., power cards). In some embodiments, the heat-generating device 140 may include a wide-bandgap semiconductor, and may be formed from a suitable material, for example and without limitation, diamond, silicon carbide (SiC), or the like. In embodiments, in which the heat-generating device 140 includes an electronics device, the heat-generating device 140 may be electrically coupled to electrodes such as a gate electrode via a wired or bonded connection.

In embodiments in which the heat-generating device 140 includes a power electronics device, the power electronics device may be used in a vehicular electrical system, for example as part of an inverter system in an electric or hybrid-electric vehicle. In vehicular applications, the heat-generating device 140 may generate significant heat flux that should be dissipated to maintain the heat-generating device 140 at a suitable operating temperature. While the heat-generating devices 140 described herein are generally described as being power electronics devices utilized in a vehicular electrical system, it should be understood that the heat-generating devices 140 described herein may include devices suitable for use in any other application.

Figure 2:
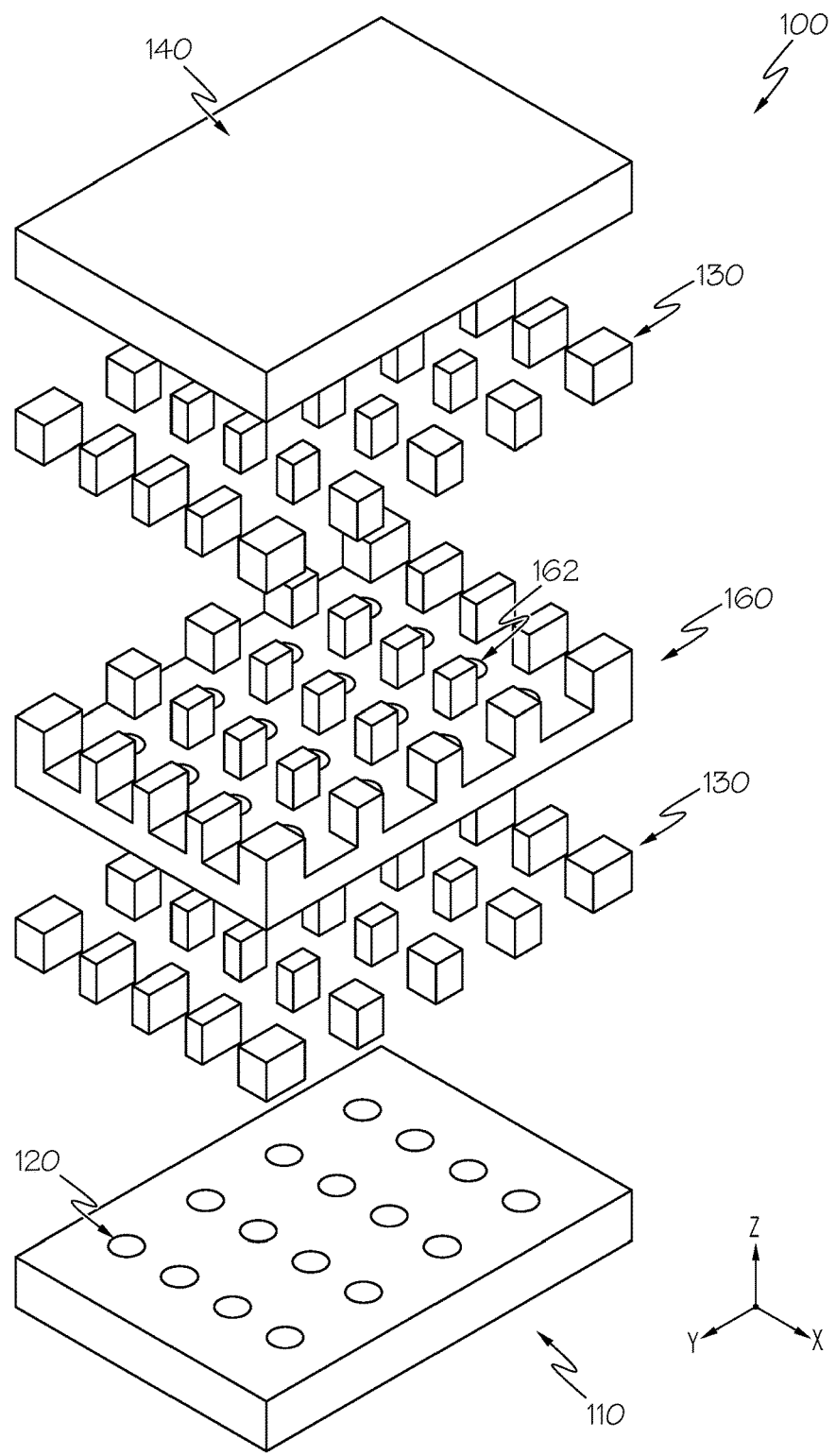
FIG. 2 schematically depicts an exploded view of the cooling assembly of FIG. 1, according to one or more embodiments shown and described herein.

Referring to FIG. 2, an exploded perspective view of the cooling assembly 100 is schematically depicted. The heat-generating device 140 is spaced apart from a substrate 110 in the vertical direction, and a mesh 160 is positioned between the heat-generating device 140 and the substrate 110 in the vertical direction. In some embodiments, the cooling assembly 100 includes a plurality of posts 130 positioned between the substrate 110 and the heat-generating device 140 in the vertical direction. In the embodiment depicted in FIG. 2, the cooling assembly 100 includes a plurality of posts 130 positioned between the mesh 160 and the heat-generating device 140, and a plurality of posts 130 positioned between the mesh 160 and the substrate 110 in the vertical direction. The plurality of posts 130 generally space the substrate 110 apart from the heat-generating device 140 in the vertical direction, which may affect an impingement distance evaluated between the substrate 110 and the heat-generating device 140, as described in greater detail herein.

Figure 3A:
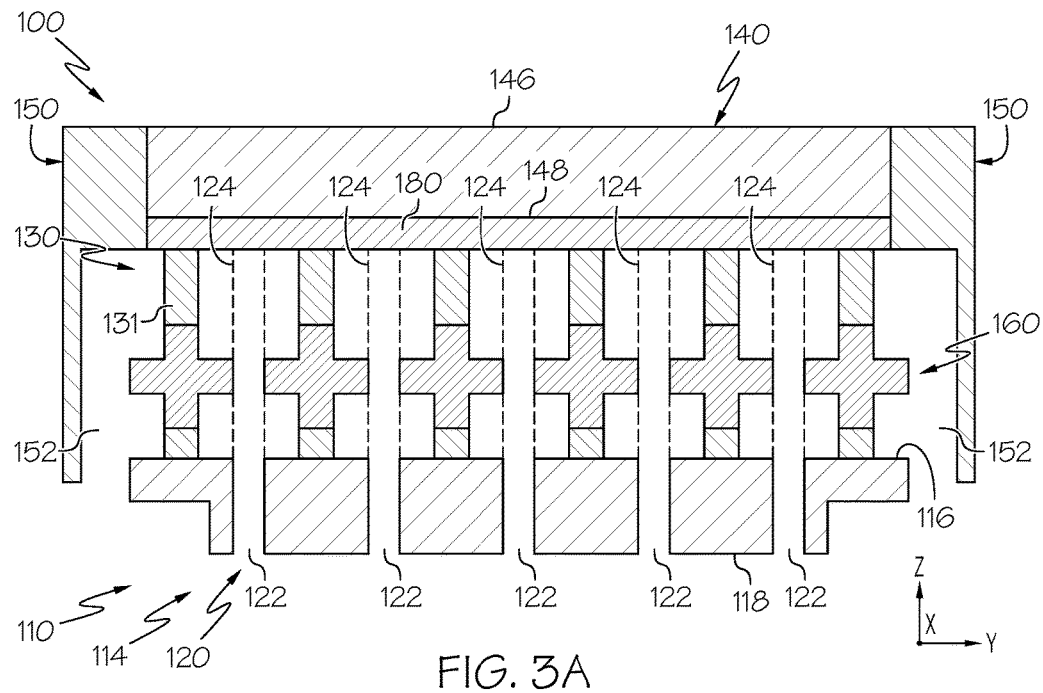
FIG. 3A schematically depicts a section view of the cooling assembly of FIG. 1 along section 3A-3A of FIG. 1, according to one or more embodiments shown and described herein.

Referring to FIG. 3A, a section view of the cooling assembly 100 along section 3A-3A of FIG. 1 is schematically depicted. The heat-generating device 140 generally defines an upper surface 146 oriented to face upwards in the vertical direction and a bottom surface 148 that is positioned opposite the upper surface 146 and that is oriented to face downwards in the vertical direction.

In some embodiments, the cooling assembly 100 optionally includes an intermediate layer 180 positioned between the substrate 110 and the heat-generating device 140 in the vertical direction, and the substrate 110 is coupled to the heat-generating device 140 through the intermediate layer 180. More particularly, the intermediate layer 180 is engaged with the bottom surface 148 of the heat-generating device 140, and the substrate 110 is coupled to the heat-generating device 140 through the intermediate layer 180. In the embodiment depicted in FIG. 3A, the intermediate layer 180 may generally include a solder plate that extends across the bottom surface 148 of the heat-generating device 140, and to which individual posts 131 of the plurality of posts 130 may be coupled. In other embodiments, the intermediate layer 180 may include solder solely positioned at discrete positions between the plurality of posts 130 and the heat-generating device 140 to couple the plurality of posts 130 to the heat-generating device 140. In these embodiments, the solder does not generally extend between individual posts 131 of the plurality of posts 130 in the lateral and/or the longitudinal directions.

In some embodiments, the intermediate layer 180 may include an encapsulated phase-change material. For example, the intermediate layer 180 may include a phase-change material, such as and without limitation, indium, hydrated salt, molten salt, metal alloys, paraffin, carboxylic acid, ester, polyol, organic matter, crystal hydrated salt, or any suitable combination thereof. The phase-change material may be encapsulated within the intermediate layer 180 by any suitable encapsulating material, for example by platinum, aluminium, or the like which may be deposited through any suitable process, such as atomic layer deposition (ALD), chemical vapor deposition, or the like. The phase-change material may be selected to transition between one phase (e.g., a solid state) to another phase (e.g., a liquid state) at or around the operating temperature of the heat-generating device 140. Without being bound by theory, the re-arrangement of the structure of a material as the material changes to a higher phase (e.g., from a solid state to a liquid state) requires thermal energy, such that the material absorbs thermal energy from its surroundings when changing to the higher phase. As such, by including an intermediate layer 180 including an encapsulated phase-change material, cooling assemblies 100 including the intermediate layer 180 with the encapsulated phase-change material may absorb more thermal energy from the heat-generating device 140 as compared to cooling assemblies that do not include an intermediate layer with the encapsulated phase-change material.

In embodiments, the substrate 110 generally includes a base portion 114 that defines an inlet face 118 that is oriented to face downward in the vertical direction, and an outlet face 116 positioned opposite the inlet face 118 and oriented to face upward in the vertical direction. The base portion 114 further defines a plurality of orifices 120 extending through the base portion 114 between the inlet face 118 and the outlet face 116. The plurality of orifices 120 includes individual orifices 122 that collectively define a plurality of jet paths 124 extending along and outward from the plurality of orifices 120. In embodiments, a span of each of the individual orifices 122 of the plurality of orifices 120 generally defines a span of each of the plurality of jet paths 124. For example, in some embodiments in which the individual orifices 122 are circular, a diameter of each of the individual orifices 122 generally defines a diameter of each of the plurality of jet paths 124. The plurality of jet paths 124 extends in the vertical direction such that the plurality of jet paths 124 is transverse to the bottom surface 148 of the heat-generating device 140. In some embodiments, the bottom surface 148 of the heat-generating device 140 may form a target surface for a cooling fluid. For example, a cooling fluid may be passed through the plurality of orifices 120 along the plurality of jet paths 124 and impinge on bottom surface 148 of the heat-generating device 140 or the intermediate layer 180 positioned on the bottom surface 148 of the heat-generating device 140, as described in greater detail herein. In some embodiments, the substrate 110 is formed of an electrically and thermally conductive material, such as copper, a copper alloy, or the like.

Figure 3B:
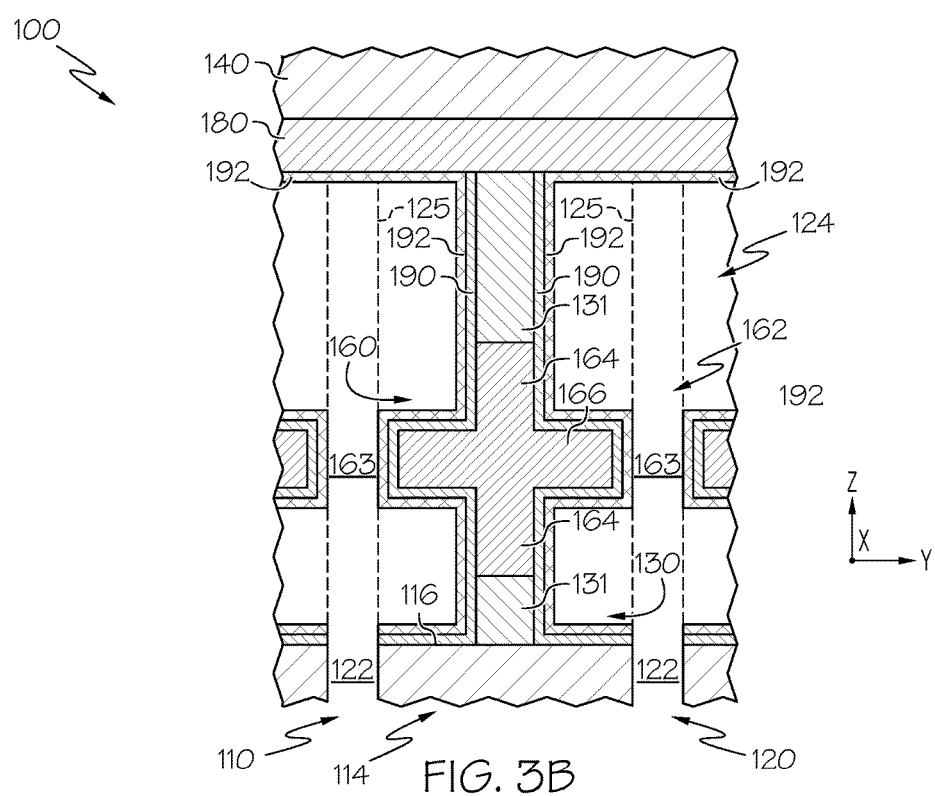
FIG. 3B schematically depicts an enlarged view of a mesh of the cooling assembly of FIG. 3A, according to one or more embodiments shown and described herein.

Referring to FIG. 3B an enlarged view of the mesh 160 is schematically depicted. In embodiments, the mesh 160 defines a plurality of pores 162 extending through the mesh 160 in the vertical direction. Individual pores 163 of the plurality of pores 162 are aligned with the individual jet paths 125 and the individual orifices 122, such that a cooling fluid passed along the plurality of jet paths 124 passes through the plurality of pores 162 of the mesh 160.

In some embodiments, a span of each of the pores 163 of the plurality of pores 162 is different than the span of the individual orifices 122 of the plurality of orifices 120. For example, in some embodiments, the span of each of the pores 163 of the plurality of pores 162 may be smaller than the span of each of the individual orifices 122 of the plurality of orifices 120. In these embodiments, the span of each of the pores 163 of the plurality of pores 162 may be less than the span of each of the jet paths 125 of the plurality of jet paths 124 positioned downward from the mesh 160, since the span of each of the jet paths 125 is generally defined by the span of the individual orifices 122. In this way, the plurality of pores 162 of the mesh 160 may restrict the plurality of jet paths 124, which may affect a velocity of cooling fluid passing upward through the plurality of pores 162 toward the heat-generating device 140, for example as a result of the Bernoulli effect. Furthermore, the span of the plurality of pores 162 of the mesh 160 may be selected to assist in focusing cooling fluid passing through the plurality of jet paths 124, which may further assist in dissipating heat from the heat-generating device 140. While the plurality of pores 162 and the plurality of orifices 120 are generally depicted as including a circular shape where the span of the plurality of pores 162 and the plurality of orifices 120 generally defines a diameter, in other embodiments, the plurality of pores 162 and/or the plurality of orifices 120 may include any suitable geometry, for example and without limitation, a rectangular shape, a square shape, or the like. In the embodiment depicted in FIG. 3B, the mesh 160 is coupled to the heat-generating device 140 through posts 131 of the plurality of posts 130, and the mesh 160 is coupled to the base portion 114 of the substrate 110 through posts 131 of the plurality of posts 130. The posts 131 may generally space the mesh 160 apart from the base portion 114 of the substrate 110 and/or the heat-generating device 140 in the vertical direction. By spacing the mesh 160 apart from the base portion 114 of the substrate 110, the posts 131 may affect the flow characteristics (e.g., flow velocity and/or flow path) of cooling fluid being passed along the plurality of jet paths 124. In embodiments, the posts 131 of the plurality of posts 130 may electrically couple and/or thermally couple the mesh 160 to the heat-generating device 140 and the base portion 114 of the substrate 110, and the plurality of posts 130 may generally be formed of an electrically and thermally conductive material, for example and without limitation, copper, a copper alloy, solder, or the like, and may be deposited in any suitable manner, for example and without limitation an additive manufacturing process such as transient liquid phase solder deposition or the like. In some embodiments, the mesh 160 may be formed of an electrically conductive material, such that the heat-generating device 140 is electrically coupled and/or thermally coupled to the base portion 114 of the substrate 110 through the mesh 160. For example, in some embodiments, the mesh 160 may be formed of an electrically and thermally conductive material, such as copper, a copper alloy, solder, or the like.

Without being bound by theory, the size and shape of posts 131 of the plurality of posts 130 and the mesh 160 influences the transmission of electrical current between the base portion 114 and the heat-generating device 140 through the plurality of posts 130 and the mesh 160, as well as the transmission of thermal energy through the plurality of posts 130 and the mesh 160, for example to a cooling fluid in contact with the plurality of posts 130 and the mesh 160. In one embodiment, each of the posts 131 define a cross-sectional area evaluated in a plane extending in the lateral and the longitudinal directions that is between 0.25 millimeters squared and 0.75 millimeters squared. In another embodiment, each of the posts 131 define a cross-sectional area evaluated in a plane extending in the lateral and the longitudinal directions that is that is about 0.5 millimeters squared. The specific geometry and cross-sectional area of each of the posts 131 of the plurality of posts 130 and the mesh 160 may be selected to achieve desired cooling and/or electrical transmission properties.

In embodiments, the mesh 160 includes a planar portion 166 that generally defines the plurality of pores 162, and a plurality of engagement portions 164 extending outward from the planar portion 166. In the embodiment depicted in FIG. 3B, the mesh 160 includes a plurality of engagement portions 164 extending upward from the planar portion 166 in the vertical direction, and a plurality of engagement portions 164 extending downward from the planar portion 166 in the vertical direction. The plurality of engagement portions 164 generally extend outward from the planar portion 166 in the vertical direction, thereby spacing the planar portion 166 apart from heat-generating device 140 and the base portion 114 of the substrate 110. While in the embodiment depicted in FIG. 3B, the mesh 160 includes engagement portions 164 extending upward from the planar portion 166 and engagement portions 164 extending downward from the planar portion 166, in other embodiments, the mesh 160 may include only engagement portions 164 extending upward from the planar portion 160 or only engagement portions 164 extending downward from the planar portion 160, as described in greater detail herein. In other embodiments, the mesh 160 may include only the planar portion 166 and may be formed without the engagement portions 164. The inclusion or omission of the engagement portions 164 and the positioning of the engagement portions 164 (i.e., extending upward and/or downward from the planar portion 166) may impact the flow characteristics of cooling fluid impinged on the heat-generating device 140 and/or the intermediate layer 180.

For example, an impingement distance (i.e., a distance evaluated between the plurality of orifices 120 and the bottom surface 148 of the heat-generating device 140 or the intermediate layer 180) influences the amount of thermal energy that may be absorbed from the heat-generating device 140 when cooling fluid passing through the plurality of orifices 120 is impinged against the heat-generating device 140 and/or the intermediate layer 180. As shown in FIG. 3B, the impingement distance is dependent upon the height of the plurality of posts 130 and the height of the engagement portions 164 of the mesh 160 evaluated in the vertical direction. As such, the height of the plurality of posts 130 and the height of the mesh 160 may be selected to achieve a desired impingement distance. In some embodiments, the height of the plurality of posts 130 and the mesh 160 evaluated in the vertical direction is between 100 micrometers and 300 micrometers, inclusive of the endpoints. In one embodiment, the height of the plurality of posts 130 and the mesh 160 evaluated in the vertical direction is about 200 micrometers.

In some embodiments, an encapsulated phase-change layer 190 may be positioned on the mesh 160, the substrate 110, and/or the posts 131 of the plurality of posts 130. In some embodiments, the encapsulated phase-change layer 190 may be positioned within the mesh 160, forming at least a portion of the mesh 160. The encapsulated phase-change layer 190 may be in communication with the intermediate layer 180, for example, in embodiments in which the intermediate layer 180 includes a phase-change material. In other embodiments, for example in embodiments in which the intermediate layer 180 does not include a phase-change material, the encapsulated phase-change layer 190 positioned on the mesh 160, the substrate 110, and/or the posts 131 may be separate and distinct from the intermediate layer 180.

Similar to the phase-change material of the intermediate layer 180, phase-change material within the encapsulated phase-change layer 190 may include, for example and without limitation, indium, hydrated salt, molten salt, metal alloys, paraffin, carboxylic acid, ester, polyol, organic matter, crystal hydrated salt, or any suitable combination thereof. Phase-change material within the encapsulated phase-change layer 190 may be encapsulated by any suitable encapsulating material, for example, by platinum or aluminium that may be deposited through any suitable process, such as ALD, chemical vapor deposition, or the like. Phase-change material within the encapsulated phase-change layer 190 may be selected to transition between one phase (e.g. a solid state) to another phase (e.g. a liquid state) at or around the operating temperature of the heat-generating device 140. In operation, the heat-generating device 140 transmits thermal energy to the posts 131 and the mesh 160, for example through the intermediate layer 180 and/or through contact between the posts 131 and the heat-generating device 140. The phase-change layer 190 may absorb thermal energy from the posts 131 and the mesh 160 as phase-change material within the phase-change layer 190 transitions between phases. As such, cooling assemblies 100 including the encapsulated phase-change layer 190 positioned on the mesh 160, the substrate 110, and/or the plurality of posts 130 may absorb more thermal energy from the heat-generating device 140, as compared to configurations that do not include the with the encapsulated phase-change layer 190.

Figure 4:
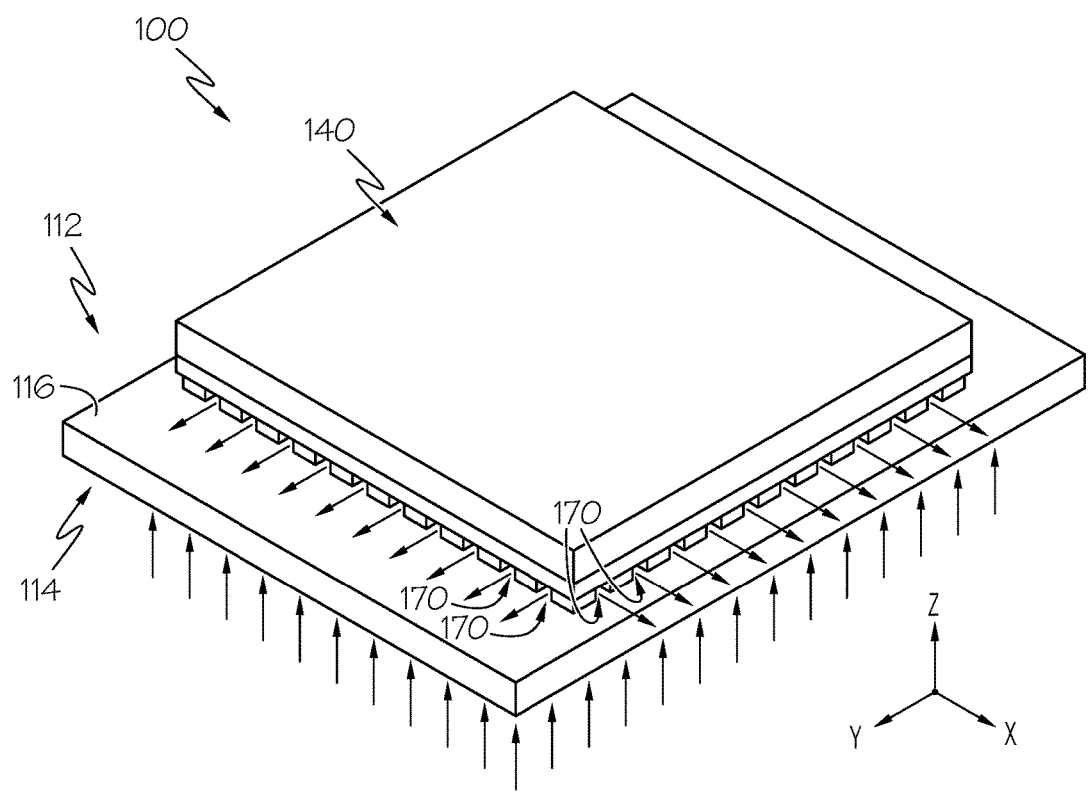
FIG. 4 schematically depicts a perspective view of a substrate and a heat-generating device of the cooling assembly of FIG. 1, according to one or more embodiments shown and described herein.

Referring collectively to FIGS. 3A, 3B, and 4, the section views of the cooling assembly 100 and an enlarged side view of the cooling assembly 100 is depicted with the housing 150 (FIG. 1) removed. In operation, the heat-generating device 140 generates heat that should be dissipated to maintain the heat-generating device 140 within an acceptable temperature range. To dissipate heat generated by the heat-generating device 140, a cooling fluid is passed between the inlet face 118 and the outlet face 116 through individual orifices 122 of the plurality of orifices 120 and impinges on the heat-generating device 140 and/or the intermediate layer 180. In other embodiments, such as embodiments that do not include the intermediate layer 180 and/or in which the intermediate layer 180 does not extend between the posts 131 of the plurality of posts 130, the cooling fluid may directly impinge on the bottom surface 148 of the heat-generating device 140. The cooling fluid may be driven through the plurality of orifices 120, for example by a pump or the like.

Subsequent to impinging on the heat-generating device 140, the cooling fluid flows outward towards an outer perimeter of the substrate 110. More particularly, the cooling fluid generally passes through cooling fluid passageways 170 positioned between the posts 131 of the plurality of posts 130 and/or between the engagement portions 164 of the mesh 160, toward the outer perimeter of the substrate 110.

Referring again to FIG. 3A, the housing 150 may generally encapsulate the substrate 110, such that the cooling fluid passageways 170 (FIG. 4) are contained within the housing 150. In embodiments, the housing 150 and the substrate 110 and the housing 150 define an outlet channel 152 positioned between the housing 150 and the outer perimeter of the substrate 110 and in fluid communication with the cooling fluid passageways 170 (FIG. 4). As the cooling fluid flows outward in the lateral and the longitudinal directions along the cooling fluid passageways 170 (FIG. 4) to the outer perimeter of the substrate 110, the cooling fluid may flow downward through the outlet channel 152. The cooling fluid may subsequently be cooled, and then passed through the plurality of orifices 120 to impinge on the heat-generating device 140 again, thereby repeating the process.

In some embodiments, the cooling fluid may be formed from an electrically-conductive fluid, such as an ethylene glycol mixture, water, or the like. In these embodiments, the substrate 110, the heat-generating device 140, the plurality of posts 130, and/or the mesh 160 may be electrically insulated from the cooling fluid, for example by an electrically insulating layer 192 positioned on surfaces of the substrate 110, the heat-generating device 140, the plurality of posts 130, and/or the mesh 160, as shown in FIG. 3B. The electrically-insulating layer 192 is formed from an electrically-insulating material that inhibits the transmission of electrical current through the electrically-insulating layer 192, such as and without limitation, aluminum oxide, phosphate, parylene, or the like. In embodiments, the electrically-insulating layer 192 may have a thickness of less than 1 micrometer and may be deposited on the substrate 110, the heat-generating device 140, the plurality of posts 130, and/or the mesh 160 through a suitable deposition process, such as atomic layer deposition, chemical vapor deposition, or the like. While the embodiment depicted in FIG. 3B shows the electrically-insulating layer 192 positioned over the encapsulated phase-change layer 190 and the intermediate layer 180, in other embodiments, the electrically-insulating layer 192 may be positioned beneath the encapsulated phase-change layer 190 and the intermediate layer 180, such that the electrically-insulating layer 192 is positioned between the encapsulated phase-change layer 190 and/or the intermediate layer 180 and the substrate 110, the heat-generating device 140, the plurality of posts 130, and/or the mesh 160. In other embodiments, dielectric cooling fluid may be utilized.

Figure 5:
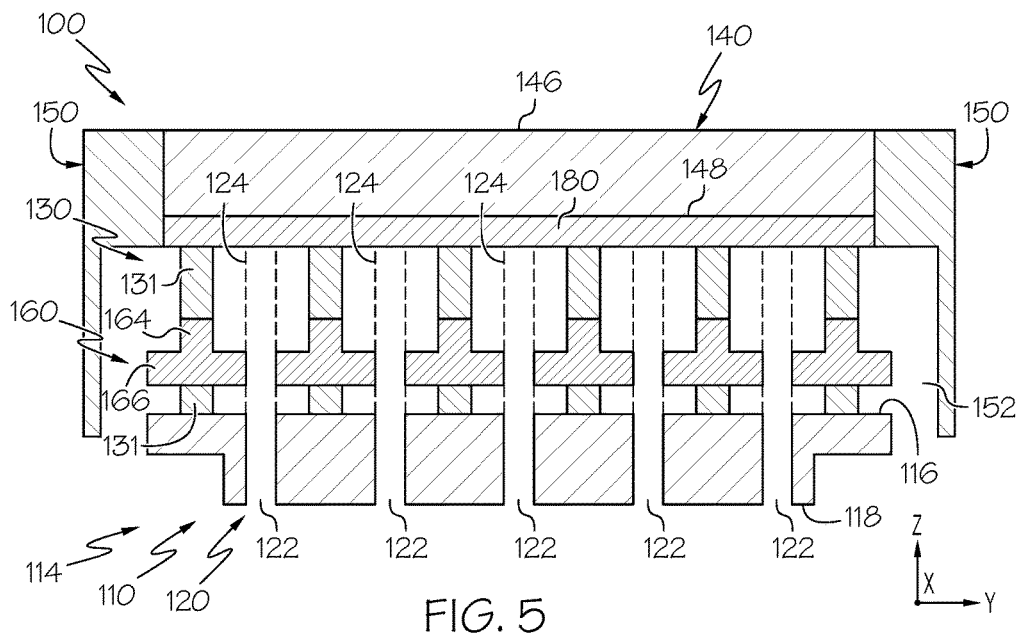
FIG. 5 schematically depicts a section view of the cooling assembly of FIG. 1 along section 5-5 of FIG. 1, according to one or more embodiments shown and described herein.

Referring to FIG. 5, another cross-section of the cooling assembly 100 along section 5-5 of FIG. 1 is schematically depicted. Similar to the embodiment described above and depicted in FIGS. 3A and 3B, the cooling assembly 100 includes the heat-generating device 140, the plurality of posts 130, the mesh 160, and the substrate 110. The cooling assembly 100 may further include the encapsulated phase-change layer 190 (FIG. 3B) positioned on the mesh 160, the substrate 110, and/or on the plurality of posts 130. However, in the embodiment depicted in FIG. 5, the mesh 160 includes engagement portions 164 extending only upward from the planar portion 166 of the mesh 160. By only including engagement portions 164 that extend upward from the planar portion 166 of the mesh 160, the mesh 160 may be positioned closer to the base portion 114 of the substrate 110 in the vertical direction, as compared to the embodiment described above and depicted in FIGS. 3A and 3B. Furthermore, by only including engagement portions 164 that extend upward from the planar portion 166 of the mesh 160, the distance between the base portion 114 of the substrate 110 to the heat-generating device 140 may be reduced, thereby reducing the impingement distance. As noted above, flow characteristics (e.g., flow velocity) of cooling fluid passing along the plurality of jet paths 124 and impinging on the bottom surface 148 of the heat-generating device 140 and/or the intermediate layer 180 may be tuned to achieve desired cooling properties by changing the distance between the mesh 160 and the base portion 114 of the substrate 110 and/or by changing the distance between the base portion 114 of the substrate 110 and the bottom surface 148 of the heat-generating device 140.

Figure 6:
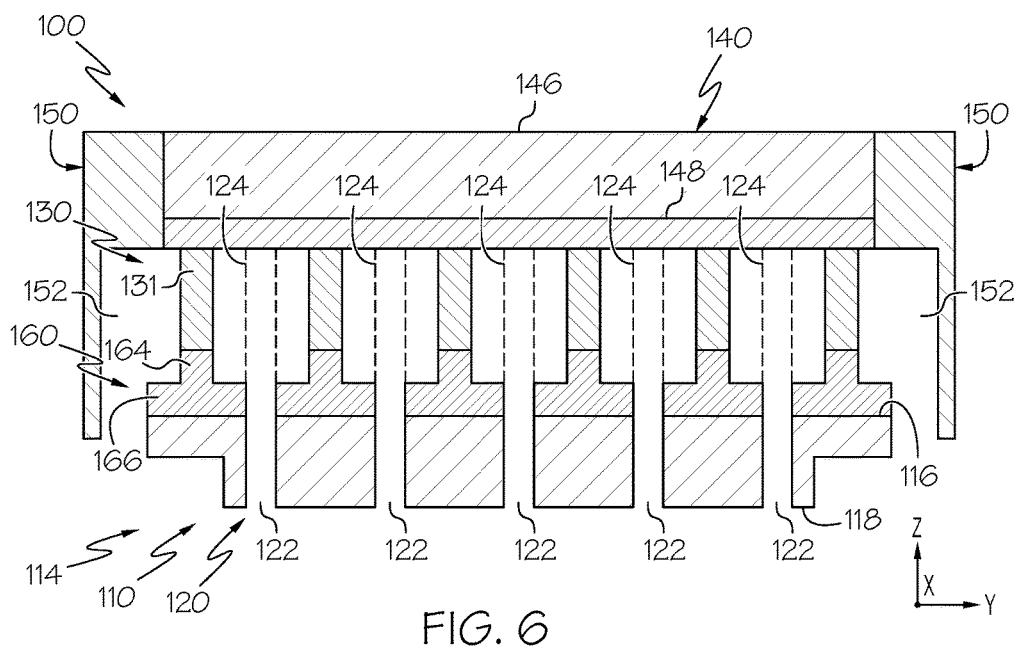
FIG. 6 schematically depicts a section view of the cooling assembly of FIG. 1 along section 6-6 of FIG. 1, according to one or more embodiments shown and described herein.

Referring to FIG. 6, another cross-section of the cooling assembly 100 along section 6-6 of FIG. 1 is schematically depicted. Similar to the embodiment described above and depicted in FIGS. 3A and 3B, the cooling assembly 100 includes the heat-generating device 140, the plurality of posts 130, the mesh 160, and the substrate 110. The cooling assembly 100 may further include the encapsulated phase-change layer 190 (FIG. 3B) positioned on the mesh 160, the substrate 110, and/or on the plurality of posts 130. However, in the embodiment depicted in FIG. 6, the mesh 160 only includes engagement portions 164 extending upward from the planar portion 166 of the mesh 160 and planar portion 166 of the mesh 160 is positioned adjacent to and is in contact with the outlet face 116 of the base portion 114 of the substrate 110.

By positioning the planar portion 166 of mesh 160 adjacent to and in contact with the outlet face 116 of the base portion 114 of the substrate 110, the impingement distance between the base portion 114 of the substrate 110 and the bottom surface 148 of the heat-generating device 140 and/or the intermediate layer 180 may be reduced as compared to configurations in which the mesh 160 is spaced apart from the substrate 110. As noted above, the flow characteristics (e.g., flow velocity, etc.) of a cooling fluid passing along the plurality of jet paths 124 and impinging on the bottom surface 148 of the heat-generating device 140 and/or the intermediate layer 180 may be tuned to achieve desired cooling properties by changing the distance between the mesh 160 and the base portion 114 of the substrate 110 and/or by changing the distance between the base portion 114 of the substrate 110 and the bottom surface 148 of the heat-generating device 140. By minimizing the impingement distance between the base portion 114 of the substrate 110 and the bottom surface 148 of the heat-generating device 140, a velocity of the cooling fluid passing along the plurality of jet paths 124 may be maximized, thereby increasing the amount of thermal energy that may be dissipated from the heat-generating device 140.

Figure 7:
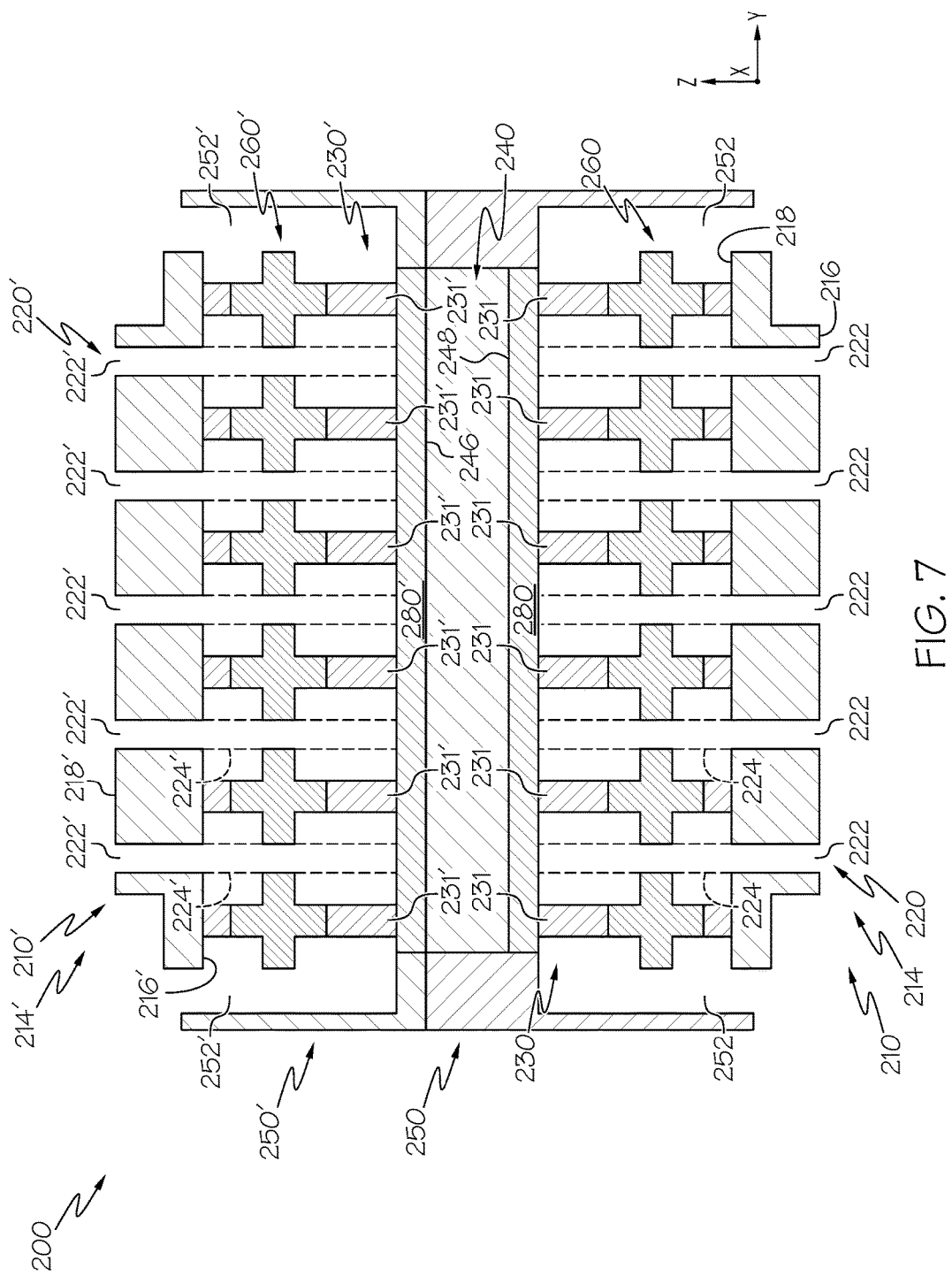
FIG. 7 schematically depicts a section view of another cooling assembly, according to one or more embodiments shown and described herein.

Referring now to FIG. 7, a section view of another cooling assembly 200 is schematically depicted. Like the embodiment described above and depicted in FIG. 3A, the cooling assembly 200 includes a heat-generating device 240 defining an upper surface 246 and a bottom surface 248 positioned opposite the upper surface 246. The cooling assembly 200 further includes the substrate 210 coupled to the bottom surface 248 of the heat-generating device 240 through the mesh 260 and/or through the posts 231 of the plurality of posts 230. In embodiments, the cooling assembly 200 may further include the phase-change layer 190 (FIG. 3B) positioned on the plurality of posts 230, the mesh 260, and/or the substrate 210.

However, in the embodiment depicted in FIG. 7, the substrate 210 is a first substrate 210, and the cooling assembly 200 further includes a second substrate 210' and a second mesh 260' electrically coupled and/or thermally coupled to the upper surface 246 of the heat-generating device 240 through a plurality of posts 230'. The first and the second substrates 210, 210' are substantially the same, and each include the base portion 214, 214', respectively, the base portions 214, 214' defining the plurality of orifices 220, 220' extending through the base portions 214, 214', respectively. The orifices 222, 222' of the plurality of orifices 220, 220' each define the plurality of jet paths 224, 224', respectively extending along and outward from the orifices 222, 222'. The plurality of jet paths 224, 224' pass through the meshes 260, 260', respectively, and the mesh 260', the plurality of posts 230', and/or the substrate 210' may include the phase-change layer 190 (FIG. 3B).

In the embodiment depicted in FIG. 7, the cooling assembly 200 optionally further includes an intermediate layer 280' positioned between posts 231' and the upper surface 246 of the heat-generating device 240. In embodiments, in which the heat-generating device 240 includes an electronics device, the heat-generating device 240 may be electrically coupled to electrodes such as a gate electrode via a wired or bonded connection.

Cooling fluid, as described above, may be passed through the orifices 222 of the first substrate 210 and impinge on the intermediate layer 280 and/or the bottom surface 248 of the heat-generating device 240. However, in the embodiment depicted in FIG. 7, cooling fluid may also be passed through the orifices 222' of the second substrate 210' and impinge on the intermediate layer 280' and/or the upper surface 246 of the heat-generating device 240. In this way, cooling fluid may be impinged on both the upper surface 246 and the bottom surface 248, of the heat-generating device 240, which may increase the amount of thermal energy that may be transferred from the heat-generating device 240 to the cooling fluid. Furthermore, in embodiments in which both the intermediate layers 280, 280' include a phase-change material, the pair of intermediate layers 280, 280' may absorb more thermal energy from the heat-generating device 240, as compared to configurations that include only a single intermediate layer. Furthermore, in embodiments that includes phase-change layers 190 (FIG. 3B) positioned on both of the meshes 260, 260', both of the posts 231, 231', and or both of the substrates 210, 210', the phase change layers 190 may absorb more thermal energy from the heat-generating device 240, as compared to configurations that include a single phase change layer.

In some embodiments, the cooling assembly 200 may further include a second housing 250' that at least partially encapsulates the second electrically-conductive substrate 212'. The housing 250 and the second housing 250' may both define the outlet channels 252, 252', respectively, through which cooling fluid may pass after impinging on the heat-generating device 240, as described above.

Accordingly, it should now be understood that embodiments described herein are directed to cooling assemblies including a heat-generating device and a substrate coupled to the heat-generating device. The substrate generally includes a base portion defining a plurality of orifices extending through the base portion and a plurality of jet paths extending along and outward from the plurality of orifices. A mesh is coupled to the substrate, the mesh including a plurality of pores that are aligned with the plurality of orifices and the plurality of jet paths. The heat-generating device is coupled to the mesh and defines a bottom surface that is oriented transverse to the plurality of jet paths. Cooling fluid may be passed through the plurality of jet paths, through the plurality of pores of the mesh, and impinge on the bottom surface of the heat-generating device to remove thermal energy generated by the heat-generating device.

The plurality of pores of the mesh may change the flow pattern and/or the flow velocity of the cooling fluid to optimize the dissipation of thermal energy as the cooling fluid impinges on the heat-generating device. Additionally, in embodiments described herein, an encapsulated phase-change layer is positioned on the mesh and/or the substrate, and the phase-change layer may further dissipate heat from the heat-generating device, which may further assist in maintaining the heat-generating device at an acceptable operating temperature.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. An assembly comprising:
a substrate comprising a base portion defining a plurality of orifices that extend through the base portion, the plurality of orifices defining a plurality of jet paths extending along and outward from the plurality of orifices;
a mesh coupled to the base portion, the mesh defining a plurality of pores aligned with the plurality of jet paths;
an encapsulated phase-change layer positioned on the mesh; and
a heat-generating device coupled to the mesh opposite the base portion, the heat-generating device defining a bottom surface that is oriented transverse to the plurality of jet paths.

2. The assembly of claim 1, wherein a span of each orifice of the plurality of orifices of the base portion is different than a span of each of the pores of the plurality of pores of the mesh.

3. The assembly of claim 1, wherein the mesh is spaced apart from the base portion in a vertical direction extending between the base portion and the heat-generating device.

4. The assembly of claim 1, wherein the mesh comprises a planar portion defining the plurality of pores, and wherein the planar portion of the mesh is adjacent to and in contact with an outlet face of the base portion of the substrate.

5. The assembly of claim 1, further comprising a plurality of posts positioned between the base portion and the mesh in a vertical direction extending between the base portion and the heat-generating device.

6. The assembly of claim 5, wherein the encapsulated phase-change layer is positioned on the plurality of posts.

7. The assembly of claim 1, further comprising a plurality of posts positioned between the mesh and the heat-generating device in a vertical direction extending between the base portion and the heat-generating device.

8. The assembly of claim 1, wherein the mesh comprises a planar portion defining the plurality of pores, and a plurality of engagement portions extending outward from the planar portion in a vertical direction extending between the substrate and the heat-generating device.

9. An electronics assembly comprising:
a substrate comprising a base portion defining a plurality of orifices that extend through the base portion, the plurality of orifices defining a plurality of jet paths extending along and outward from the plurality of orifices;
a mesh coupled to the base portion, the mesh defining a plurality of pores aligned with the plurality of jet paths;
an encapsulated phase-change layer positioned within the mesh; and
a power electronics device electrically coupled to the substrate through the mesh.

10. The electronics assembly of claim 9, wherein the power electronics device defines a bottom surface that is oriented transverse to and intersects the plurality of jet paths.

11. The electronics assembly of claim 9, wherein a span of each orifice of the plurality of orifices of the base portion is different than a span of each pore of the plurality of pores of the mesh.

12. The electronics assembly of claim 9, wherein the mesh is spaced apart from the base portion in a vertical direction extending between the base portion and the power electronics device.

13. The electronics assembly of claim 9, wherein the mesh comprises a planar portion defining the plurality of pores, and wherein the planar portion of the mesh is adjacent to and in contact with an outlet face of the base portion of the substrate.

14. The electronics assembly of claim 9, further comprising a plurality of posts positioned between the base portion and the mesh in a vertical direction extending between the base portion and the power electronics device and electrically coupling the mesh to the power electronics device.

15. The electronics assembly of claim 14, wherein the encapsulated phase-change layer is positioned on the plurality of posts.

16. The electronics assembly of claim 9, further comprising an electrically insulating layer positioned on the plurality of posts.

17. A method for cooling a heat-generating device, the method comprising:

passing a cooling fluid along a jet path extending along an orifice extending through a substrate;

passing the cooling fluid through a pore of mesh, wherein the pore is aligned with the orifice;

impinging the cooling fluid on a heat-generating device positioned opposite the orifice and thermally coupled to the heat-generating device;

heating the mesh; and changing a matter phase of an encapsulated phase-change material of a phase-change layer positioned on the mesh.

18. The method of claim 17, wherein impinging the cooling fluid on the heat-generating device comprises impinging the cooling fluid directly on the heat-generating device.

19. The method of claim 17, wherein impinging the cooling fluid on the heat-generating device comprises impinging the cooling fluid on an intermediate layer positioned between the substrate and the heat-generating device.

20. The method of claim 17, further comprising changing a phase of a phase-change material of an intermediate layer positioned on a bottom surface of the heat-generating device.

* * * * *